(12) United States Patent
Cheng et al.

(10) Patent No.: US 10,658,334 B2
(45) Date of Patent: May 19, 2020

(54) METHOD FOR FORMING A PACKAGE STRUCTURE INCLUDING A PACKAGE LAYER SURROUNDING FIRST CONNECTORS BESIDE AN INTEGRATED CIRCUIT DIE AND SECOND CONNECTORS BELOW THE INTEGRATED CIRCUIT DIE

(71) Applicant: Taiwan Semiconductor Manufacturing Co., Ltd., Hsinchu (TW)

(72) Inventors: Yu-Jen Cheng, New Taipei (TW); Yu-Chih Huang, Hsinchu (TW); Chih-Hua Chen, Zhubei (TW); Yu-Feng Chen, Hsinchu (TW); Hao-Yi Tsai, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/240,422

(22) Filed: Aug. 18, 2016

(65) Prior Publication Data

US 2018/0053745 A1 Feb. 22, 2018

(51) Int. Cl.
*H01L 21/56* (2006.01)
*H01L 23/538* (2006.01)
(Continued)

(52) U.S. Cl.
CPC .......... *H01L 25/0657* (2013.01); *H01L 21/56* (2013.01); *H01L 21/6835* (2013.01); *H01L 21/6836* (2013.01); *H01L 23/5389* (2013.01); *H01L 24/19* (2013.01); *H01L 24/20* (2013.01); *H01L 24/97* (2013.01); *H01L 25/105* (2013.01); *H01L 25/50* (2013.01);
(Continued)

(58) Field of Classification Search
CPC ..................................... H01L 21/563
See application file for complete search history.

(56) References Cited

U.S. PATENT DOCUMENTS 6,001,901 A * 12/1999 Shiobara .................. C08K 3/36
                                                           438/127
7,391,118 B2 * 6/2008 Tsai ........................ H01L 25/16
                                                           257/777
(Continued)

*Primary Examiner* — Anh D Mai
(74) *Attorney, Agent, or Firm* — McClure, Qualey & Rodack, LLP

(57) ABSTRACT

Package structures and methods for forming the same are provided. The method includes providing a first integrated circuit die and forming a redistribution structure over the first integrated circuit die. The method also includes forming a base layer over the redistribution structure. The base layer has first and second openings. The first openings are wider than the second openings. The method further includes forming first bumps over the redistribution structure. The first bumps have a lower portion filling the first openings. In addition, the method includes bonding a second integrated circuit die to the redistribution structure through second bumps having a lower portion filling the second openings. There is a space between the second integrated circuit die and the base layer. The method also includes forming a molding compound layer over the base layer. The molding compound layer fills the space and surrounds the first and second bumps.

20 Claims, 10 Drawing Sheets

(51) Int. Cl.
   *H01L 25/065*  (2006.01)
   *H01L 25/00*   (2006.01)
   *H01L 23/00*   (2006.01)
   *H01L 21/683*  (2006.01)
   *H01L 25/10*   (2006.01)

(52) U.S. Cl.
   CPC ............... *H01L 2221/68327* (2013.01); *H01L 2221/68359* (2013.01); *H01L 2221/68372* (2013.01); *H01L 2221/68381* (2013.01); *H01L 2224/0401* (2013.01); *H01L 2224/1403* (2013.01); *H01L 2224/16145* (2013.01); *H01L 2224/16227* (2013.01); *H01L 2224/73204* (2013.01); *H01L 2224/81005* (2013.01); *H01L 2224/81815* (2013.01); *H01L 2224/83005* (2013.01); *H01L 2224/92125* (2013.01); *H01L 2224/92244* (2013.01); *H01L 2224/97* (2013.01); *H01L 2225/06513* (2013.01); *H01L 2225/06568* (2013.01); *H01L 2225/1035* (2013.01); *H01L 2225/1058* (2013.01); *H01L 2924/14* (2013.01); *H01L 2924/1431* (2013.01); *H01L 2924/1432* (2013.01); *H01L 2924/1434* (2013.01); *H01L 2924/18161* (2013.01)

(56) References Cited

U.S. PATENT DOCUMENTS

| | | | | |
|---|---|---|---|---|
| 7,579,690 | B2 * | 8/2009 | Chia | H01L 24/24 257/723 |
| 8,361,842 | B2 | 1/2013 | Yu et al. | |
| 8,482,134 | B1 * | 7/2013 | Darveaux | H01L 24/16 257/686 |
| 8,519,537 | B2 * | 8/2013 | Jeng | H01L 23/13 257/668 |
| 8,680,647 | B2 | 3/2014 | Yu et al. | |
| 8,703,542 | B2 | 4/2014 | Lin et al. | |
| 8,759,964 | B2 | 6/2014 | Pu et al. | |
| 8,778,738 | B1 | 7/2014 | Lin et al. | |
| 8,779,601 | B2 * | 7/2014 | Gan | H01L 23/48 257/686 |
| 8,785,299 | B2 | 7/2014 | Mao et al. | |
| 8,796,846 | B2 * | 8/2014 | Lin | H01L 21/6835 257/686 |
| 8,803,306 | B1 | 8/2014 | Yu et al. | |
| 8,809,996 | B2 | 8/2014 | Chen et al. | |
| 8,829,676 | B2 | 9/2014 | Yu et al. | |
| 8,877,554 | B2 | 11/2014 | Tsai et al. | |
| 8,951,834 | B1 * | 2/2015 | Kim | H01L 21/565 257/686 |
| 8,963,339 | B2 * | 2/2015 | He | H01L 25/50 257/738 |
| 9,202,715 | B2 * | 12/2015 | Kim | H01L 21/565 |
| 2011/0037169 | A1 * | 2/2011 | Pagaila | H01L 21/561 257/737 |
| 2011/0291288 | A1 | 12/2011 | Wu et al. | |
| 2012/0018877 | A1 * | 1/2012 | Yang | H01L 23/5385 257/737 |
| 2013/0062760 | A1 | 3/2013 | Hung et al. | |
| 2013/0062761 | A1 | 3/2013 | Lin et al. | |
| 2013/0168848 | A1 | 7/2013 | Lin et al. | |
| 2013/0264684 | A1 | 10/2013 | Yu et al. | |
| 2013/0307140 | A1 | 11/2013 | Huang et al. | |
| 2013/0341786 | A1 * | 12/2013 | Hsu | H01L 21/4857 257/737 |
| 2014/0048957 | A1 * | 2/2014 | Chung | H01L 23/49816 257/777 |
| 2014/0110860 | A1 * | 4/2014 | Choi | H01L 24/29 257/774 |
| 2014/0203429 | A1 | 7/2014 | Yu et al. | |
| 2014/0225222 | A1 | 8/2014 | Yu et al. | |
| 2014/0252609 | A1 * | 9/2014 | Lee | H01L 23/49816 257/738 |
| 2014/0252646 | A1 | 9/2014 | Hung et al. | |
| 2014/0264810 | A1 * | 9/2014 | Hsu | H01L 23/3128 257/686 |
| 2014/0264930 | A1 | 9/2014 | Yu et al. | |
| 2016/0300817 | A1 * | 10/2016 | Do | H01L 25/50 |
| 2017/0140202 | A1 * | 5/2017 | Huang | G06K 9/00053 |
| 2019/0103379 | A1 * | 4/2019 | Yu | H01L 21/568 |
| 2019/0131241 | A1 * | 5/2019 | Jeng | H01L 21/4853 |
| 2019/0131283 | A1 * | 5/2019 | Chen | H01L 24/05 |
| 2019/0393153 | A1 * | 12/2019 | Wang | H01L 23/3128 |

* cited by examiner

METHOD FOR FORMING A PACKAGE STRUCTURE INCLUDING A PACKAGE LAYER SURROUNDING FIRST CONNECTORS BESIDE AN INTEGRATED CIRCUIT DIE AND SECOND CONNECTORS BELOW THE INTEGRATED CIRCUIT DIE

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes less area or a smaller height, in some applications.

New packaging technologies, such as package on package (PoP), have begun to be developed, in which a top package with a device die is bonded to a bottom package, with another device die. By adopting the new packaging technologies, various packages with different or similar functions are integrated together. These relatively new types of packaging technologies for semiconductor devices face manufacturing challenges, and they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
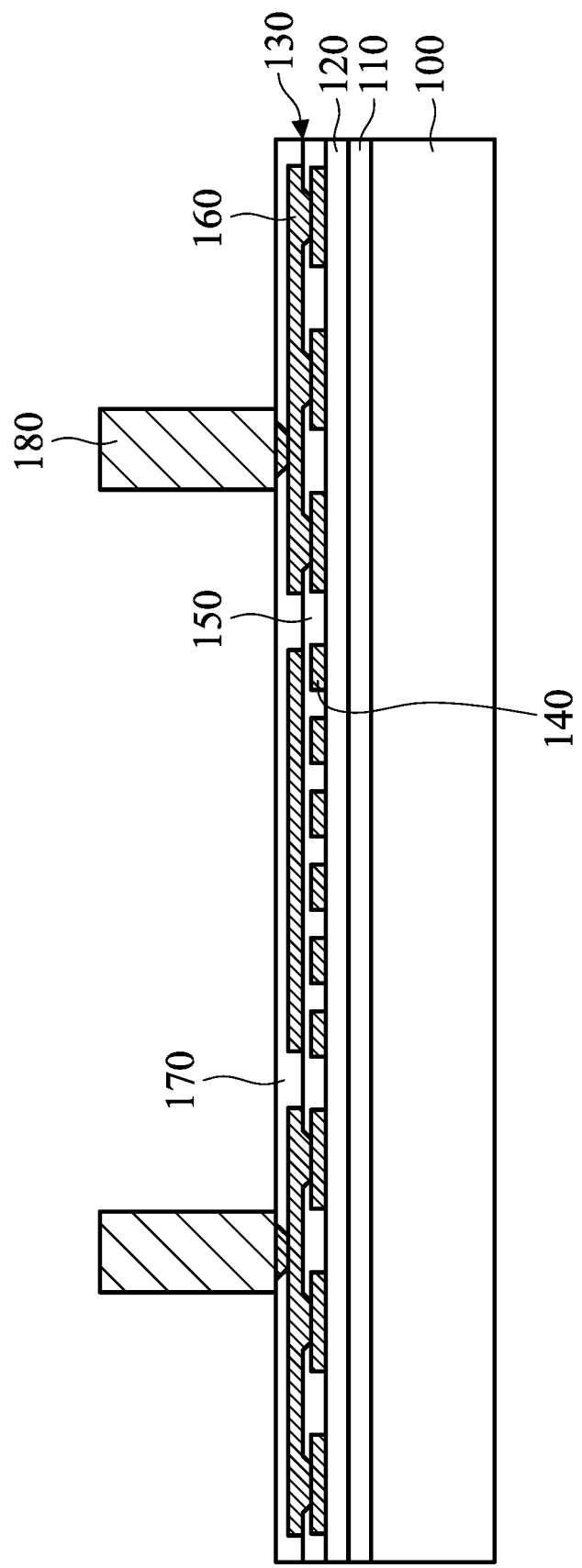
FIGS. 1A-1H are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments for a package structure and methods for forming the same are described. FIGS. 1A-1H are cross-sectional views of various stages of a process for forming a package structure, in accordance with some embodiments. Although some embodiments are discussed with operations performed in a particular order, these operations may be performed in another logical order. Additional operations can be provided before, during, and/or after the stages described in FIGS. 1A-1H. Some of the stages that are described can be replaced or eliminated for different embodiments. Additional features can be added to the package structure. Some of the features described below can be replaced or eliminated for different embodiments.

As shown in FIG. 1A, a carrier substrate 100 is provided, in accordance with some embodiments. In some embodiments, the carrier substrate 100 is used as a temporary substrate. The temporary substrate provides mechanical and structural support during subsequent processing steps, such as those described in more detail later. The carrier substrate 100 is made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

Afterwards, an adhesive layer 110 is deposited over the carrier substrate 100, in accordance with some embodiments. The adhesive layer 110 may be made of glue, or may be a lamination material, such as a foil. In some embodiments, the adhesive layer 110 is photosensitive and is easily detached from the carrier substrate 100 by light irradiation. For example, shining ultra-violet (UV) light or laser light on the carrier substrate 100 is used to detach the adhesive layer 110. In some embodiments, the adhesive layer 110 is a light-to-heat-conversion (LTHC) coating. In some other embodiments, the adhesive layer 110 is heat-sensitive and is easily detached from the carrier substrate 100 when it is exposed to heat.

Subsequently, a base layer 120 is deposited or laminated over the adhesive layer 110, in accordance with some embodiments. The base layer 120 provides structural support for bonding an integrated circuit die, which will be described in more detail later, and helps reduce die shifting issues. In some embodiments, the base layer 120 is a polymer layer or a polymer-containing layer. The base layer 120 is a poly-p-phenylenebenzobisthiazole (PBO) layer, a polyimide (PI) layer, a solder resist (SR) layer, an Ajinomoto buildup film (ABF), a die attach film (DAF), another suitable layer, or a combination thereof.

As shown in FIG. 1A, a redistribution structure 130 is formed over the base layer 120, in accordance with some embodiments. The redistribution structure 130 includes one or more conductive layers and one or more passivation layers. For example, the redistribution structure 130 includes conductive layers 140 and 160, and passivation layers 150 and 170.

The conductive layer 140 is formed over the base layer 120. The passivation layer 150 is deposited over the base layer 120, and partially covers the conductive layer 140. Portions of the conductive layer 140 are exposed from openings in the passivation layer 150. The conductive layer 160 is formed over the passivation layer 150. The conductive layer 160 is electrically connected to the conductive layer 140 through the openings in the passivation layer 150. The passivation layer 170 is deposited over the passivation layer 150, and covers the conductive layer 160.

In some embodiments, the conductive layers 140 and 160 in the redistribution structure 130 are made of metal materials. The metal material includes copper (Cu), Cu alloy, aluminum (Al), Al alloy, tungsten (W), W alloy, titanium (Ti), Ti alloy, tantalum (Ta), Ta alloy, another suitable material, or a combination thereof. In some embodiments, the conductive layers 140 and 160 in the redistribution structure 130 are formed by an electroplating process, an electroless plating process, a sputtering process, a chemical vapor deposition (CVD) process, or another applicable process.

In some embodiments, the passivation layers 150 and 170 in the redistribution structure 130 are made of polybenzoxazole (PBO), benzocyclobutene (BCB), silicone, acrylates, siloxane, another suitable material, or a combination thereof. In some other embodiments, the passivation layers 150 and 170 in the redistribution structure 130 are made of non-organic materials. The non-organic materials includes silicon oxide, un-doped silicate glass, silicon oxynitride, solder resist (SR), silicon nitride, silicon carbide, hexamethyldisilazane (HMDS), another suitable material, or a combination thereof. Multiple deposition, coating, and/or etching processes may be used to form the redistribution structure 130.

Afterwards, multiple conductive features 180 are formed over the redistribution structure 130, in accordance with some embodiments. In some embodiments, the conductive features 180 are conductive pillars or other suitable structures. The conductive features 180 may be referred to as through interposer vias (TIVs). The conductive features 180 are physically and electrically connected to one of the conductive layers in the redistribution structure 130. For example, the passivation layer 170 has openings that partially expose the conductive layer 160. The conductive features 180 are electrically connect to the conductive layer 160 through the openings in the passivation layer 170.

In some embodiments, the conductive features 180 include Cu, Al, nickel (Ni), platinum (Pt), lead-free solder (e.g., SnAg, SnCu, SnAgCu), another suitable conductive material, or a combination thereof. In some embodiments, the conductive features 180 are formed using an electroplating process, a physical vapor deposition (PVD) process, a CVD process, an electrochemical deposition (ECD) process, a molecular beam epitaxy (MBE) process, an atomic layer deposition (ALD) process, or another applicable process.

Figure 1B:
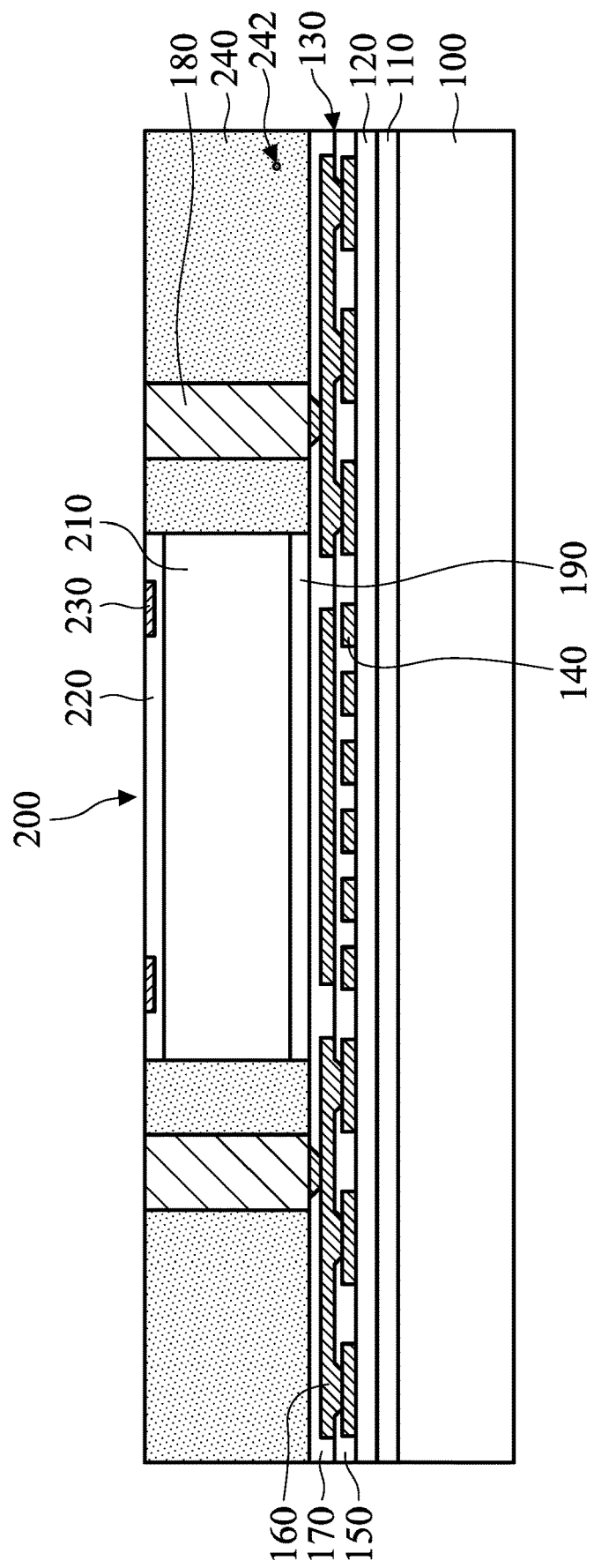

As shown in FIG. 1B, an integrated circuit die 200 is disposed on the redistribution structure 130, in accordance with some embodiments. In some embodiments, the front side (the active surface) of the integrated circuit die 200 faces away from the redistribution structure 130. The back side (the non-active surface) of the integrated circuit die 200 faces the redistribution structure 130. However, embodiments of the disclosure are not limited thereto. In some other embodiments, the front side of the integrated circuit die 200 faces the redistribution structure 130.

The integrated circuit die 200 may be a device die including transistors, diodes, or another suitable integrated circuit element. The device die may also include capacitors, inductors, resistors, another integrated circuit element, or a combination thereof. In some embodiments, the integrated circuit die 200 is a sensor die, a logic die, a central processing unit (CPU) die, a memory die, or another suitable die.

In some embodiments, the integrated circuit die 200 includes a semiconductor substrate 210, a passivation layer 220, and conductive pads 230. The integrated circuit die 200 may also include connectors on the conductive pads 230, and a protection layer surrounding the connectors. A variety of device elements may be formed in or over the semiconductor substrate 210. The device elements include active devices and/or passive devices. In some embodiments, the device elements include fingerprint recognition devices. In some other embodiments, the device elements include image sensor devices, logic devices, memory devices, other applicable types of devices, or a combination thereof.

Although FIG. 1B shows that there is one integrated circuit die 200 on the redistribution structure 130, embodiments of the disclosure are not limited thereto. In some other embodiments, there are multiple integrated circuit dies 200 on the redistribution structure 130.

In some embodiments, an adhesive film 190 is used to bond or attach the integrated circuit die 200 and the redistribution structure 130. The adhesive film 190 includes a DAF, another suitable layer, or a combination thereof.

Afterwards, a package layer 240 is deposited over the redistribution structure 130, in accordance with some embodiments. As a result, the conductive features 180 and the integrated circuit die 200 are encapsulated by the package layer 240.

In some embodiments, the package layer 240 includes a polymer material. In some embodiments, the package layer 240 includes a molding compound. In some embodiments, the package layer 240 includes filler 242 dispersed therein. The filler 242 may include insulating fibers, insulating particles, other suitable elements, or a combination thereof. In some embodiments, the filler 242 have a diameter in a range from about 2 µm to about 30 µm. In some embodiments, the diameter of the filler 242 is in a range from about 15 µm to about 30 µm.

In some embodiments, a liquid molding compound material is applied over the redistribution structure 130. The liquid molding compound material includes epoxy, silica, another suitable material, or a combination thereof. In some embodiments, a thermal process is then performed to harden the molding compound material and to transform it into the package layer 240.

In some embodiments, a molding process is used to deposit the package layer 240. The molding process includes a compression molding process or another applicable process. In some embodiments, the top surface of the deposited package layer 240 is substantially coplanar with the top surfaces of the conductive features 180 and the integrated circuit die 200.

In some other embodiments, the deposited package layer 240 covers the top surfaces of the conductive features 180 and the integrated circuit die 200. Subsequently, the deposited package layer 240 is thinned. As a result, the conductive features 180 and the integrated circuit die 200 are exposed. A planarization process may be used to thin the deposited package layer 240. The planarization process includes a grinding process, a chemical mechanical polishing (CMP) process, an etching process, another applicable process, or a combination thereof.

Figure 1C:
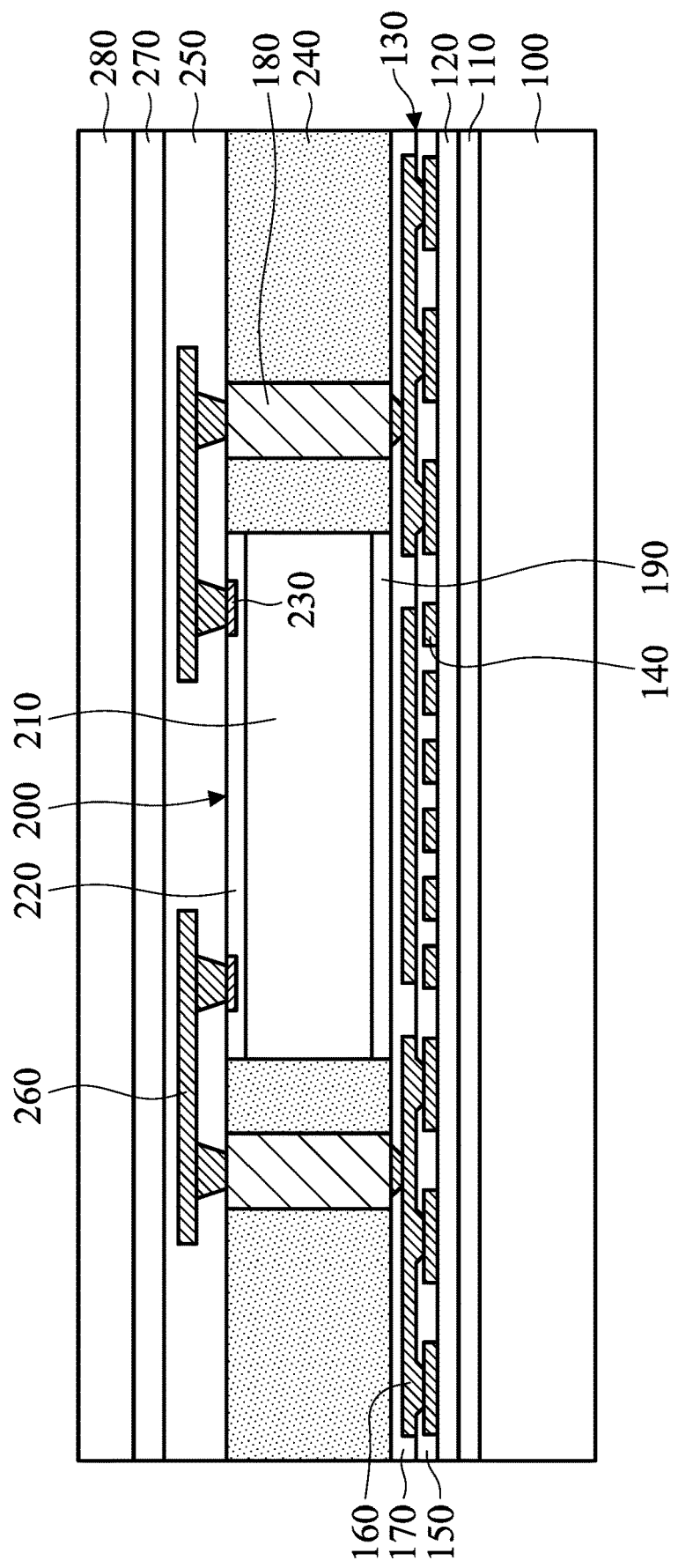

As shown in FIG. 1C, a redistribution structure including a passivation layer 250 and a conductive layer 260 is formed over the package layer 240, in accordance with some embodiments. The redistribution structure over the package layer 240 may include multiple conductive layers and passivation layers. Multiple deposition, coating, and/or etching processes are used to form the redistribution structure including the passivation layer 250 and the conductive layer 260.

The passivation layer 250 is deposited over the package layer 240. The passivation layer 250 is made of dielectric material(s) and provides stress relief for bonding stress incurred during subsequent bonding processes. In some embodiments, the passivation layer 250 is made of PBO, BCB, silicone, acrylates, siloxane, another suitable material, or a combination thereof. In some other embodiments, the passivation layer 250 is made of non-organic materials. The non-organic materials includes silicon oxide, un-doped silicate glass, silicon oxynitride, SR, silicon nitride, silicon carbide, HMDS, another suitable material, or a combination thereof.

The conductive layer 260 is embedded in the passivation layer 250. The conductive layer 260 is electrically connected to the conductive features 180 and the integrated circuit die 200. In some embodiments, the conductive layer 260 is made of a metal material. The metal material includes Cu, Cu alloy, Al, Al alloy, W, W alloy, Ti, Ti alloy, Ta, Ta alloy, another suitable material, or a combination thereof. In some embodiments, the conductive layer 260 is formed by an electroplating process, an electroless plating process, a sputtering process, a CVD process, or another applicable process.

Afterwards, a protection layer 270 is deposited over the passivation layer 250, in accordance with some embodiments. The protection layer 270 is a color film, another suitable layer, or a combination thereof. The color film may be used to prevent some layers, such as the conductive layer 260, in the package structure being exposed to users. In some other embodiments, the protection layer 270 is not formed.

Subsequently, a protection substrate 280 is provided over the passivation layer 250, in accordance with some embodiments. In some embodiments, the protection substrate 280 is used as a panel of a fingerprint recognition device. The protection substrate 280 is made of non-organic materials or another suitable material. In some embodiments, the protection substrate 280 is a glass substrate, sapphire substrate, or another suitable substrate. In some other embodiments, the protection substrate 280 is not formed.

Figure 1D:
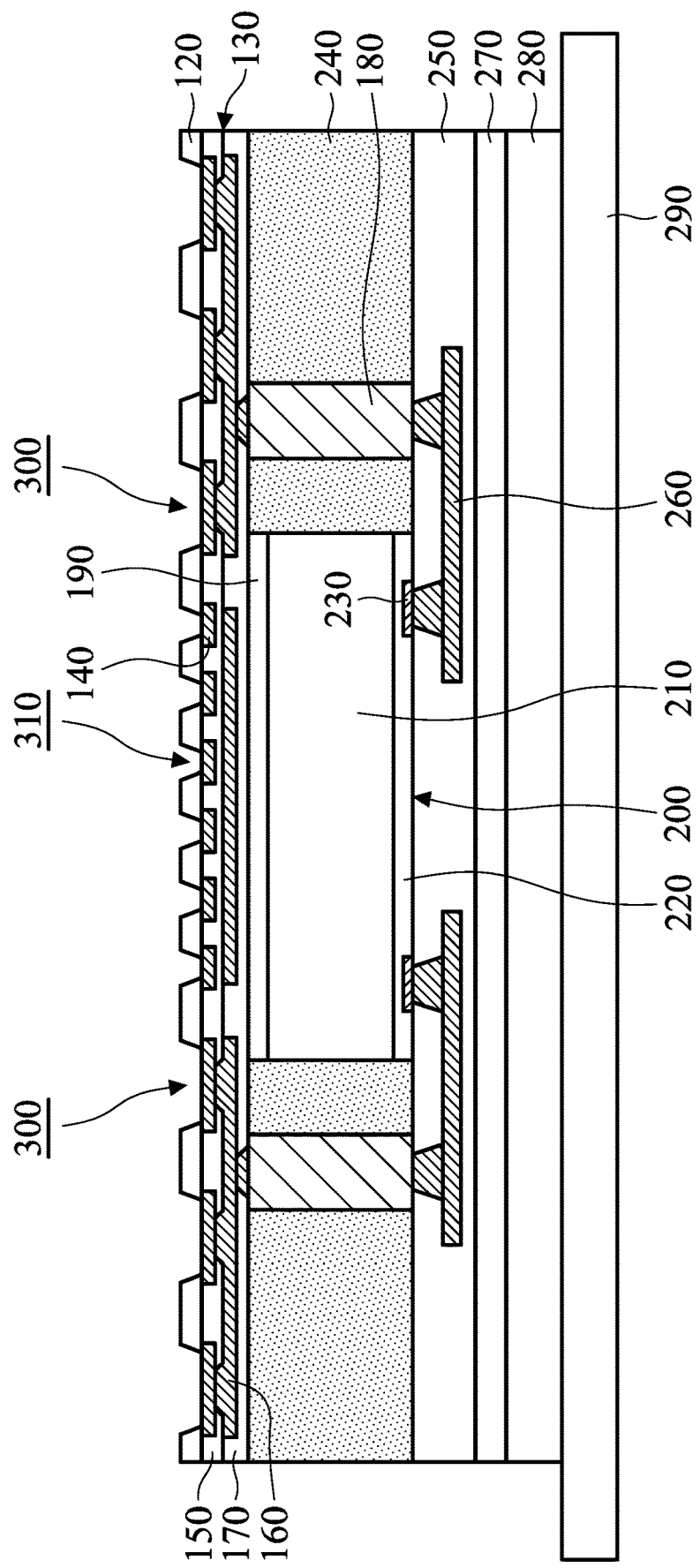

As shown in FIG. 1D, the structure as shown in FIG. 1C is flipped and attached to a carrier 290, in accordance with some embodiments. The carrier 290 includes a tape which is photosensitive or heat-sensitive and is easily detached from the protection substrate 280 or the protection layer 270.

As mentioned above, in some embodiments, the protection substrate 280 is not formed. As a result, the protection layer 270 is in direct contact with the carrier 290. However, embodiments of the disclosure are not limited thereto. In some embodiments, the protection layer 270 and the protection substrate 280 are not formed. As a result, the passivation layer 250 is in direct contact with the carrier 290.

Afterwards, the carrier substrate 100 is removed. In some embodiments, both the carrier substrate 100 and the adhesive layer 110 are removed. Suitable light may be provided to remove the adhesive layer 110 so as to remove the carrier substrate 100 as well.

Subsequently, multiple portions of the base layer 120 are removed to form openings 300 and 310, in accordance with some embodiments. The openings 300 and 310 expose portions of the redistribution structure 130, such as portions of the conductive layer 140. The openings 300 are positioned over the conductive features 180. The openings 310 are positioned over the integrated circuit die 200. The size of the openings 300 is greater than that of the openings 310. For example, the openings 300 are wider than the openings 310.

The interval between two of the openings 300 is greater than that between two of the openings 310. In some embodiments, the interval between one of the openings 300 and one of openings 310 is substantially the same as that between two of the openings 300. In some other embodiments, the interval between one of the openings 300 and one of openings 310 is different from that between two of the openings 300.

In some embodiments, a laser drilling process is performed to form the openings 300 and 310. Another applicable process, such as an etching process, may also be used to form the openings 300 and 310.

Figure 1E:
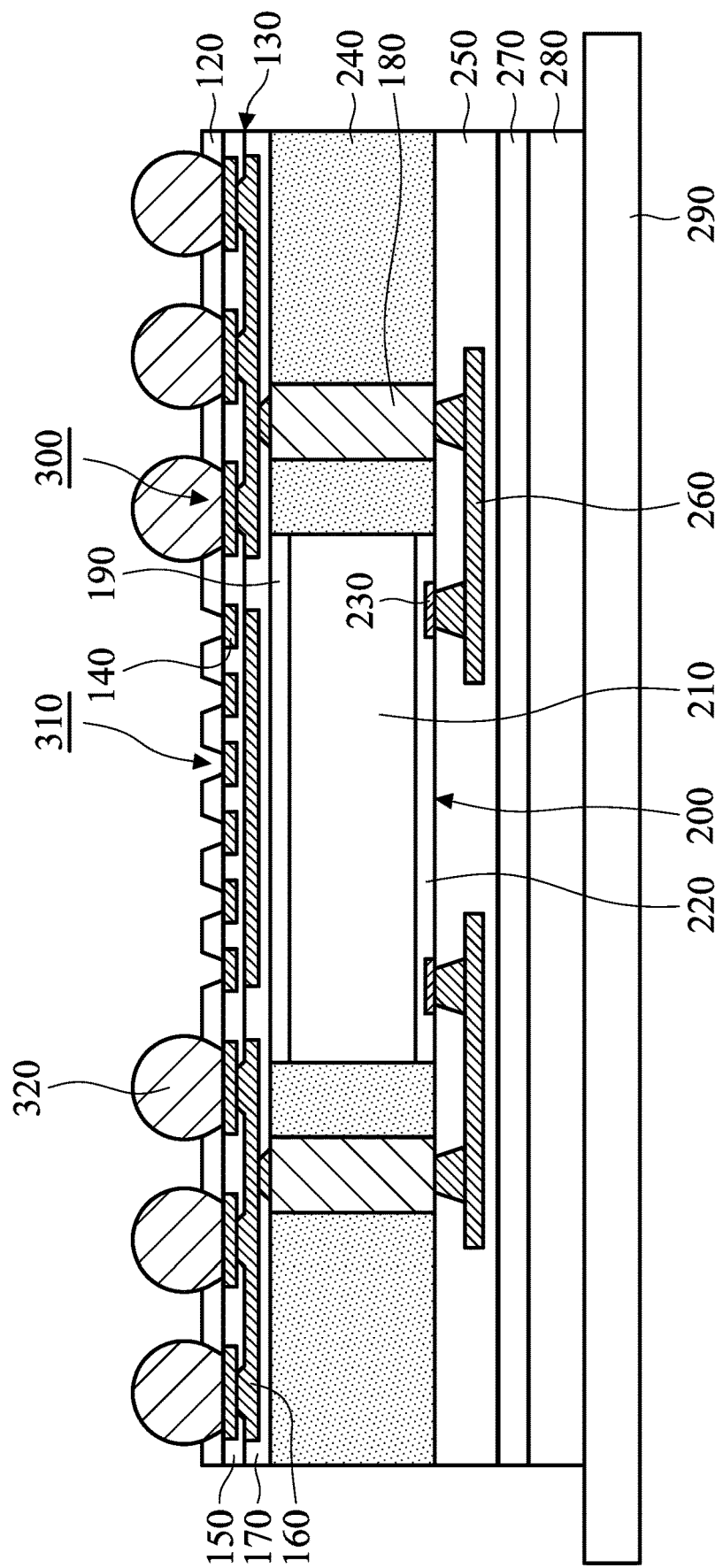

As shown in FIG. 1E, multiple connectors 320 are deposited over the redistribution structure 130, in accordance with some embodiments. The connectors 320 fill the openings 300, and protrude from the base layer 120. The connectors 320 are electrically connected to the conductive layer 140 in the redistribution structure 130. The connectors 320 include solder bumps, metal pillars, other suitable connectors, or a combination thereof.

In some embodiments, the conductive layer 140 is an under bump metallurgy (UBM) structure. The conductive layer 140 is in direct contact with the connectors 320. Embodiments of the disclosure are not limited thereto. In some other embodiments, there is an UBM structure between one of the connectors 320 and the conductive layer 140. The UBM structure may include a bond pad and one or more UBM layers.

Figure 1F:
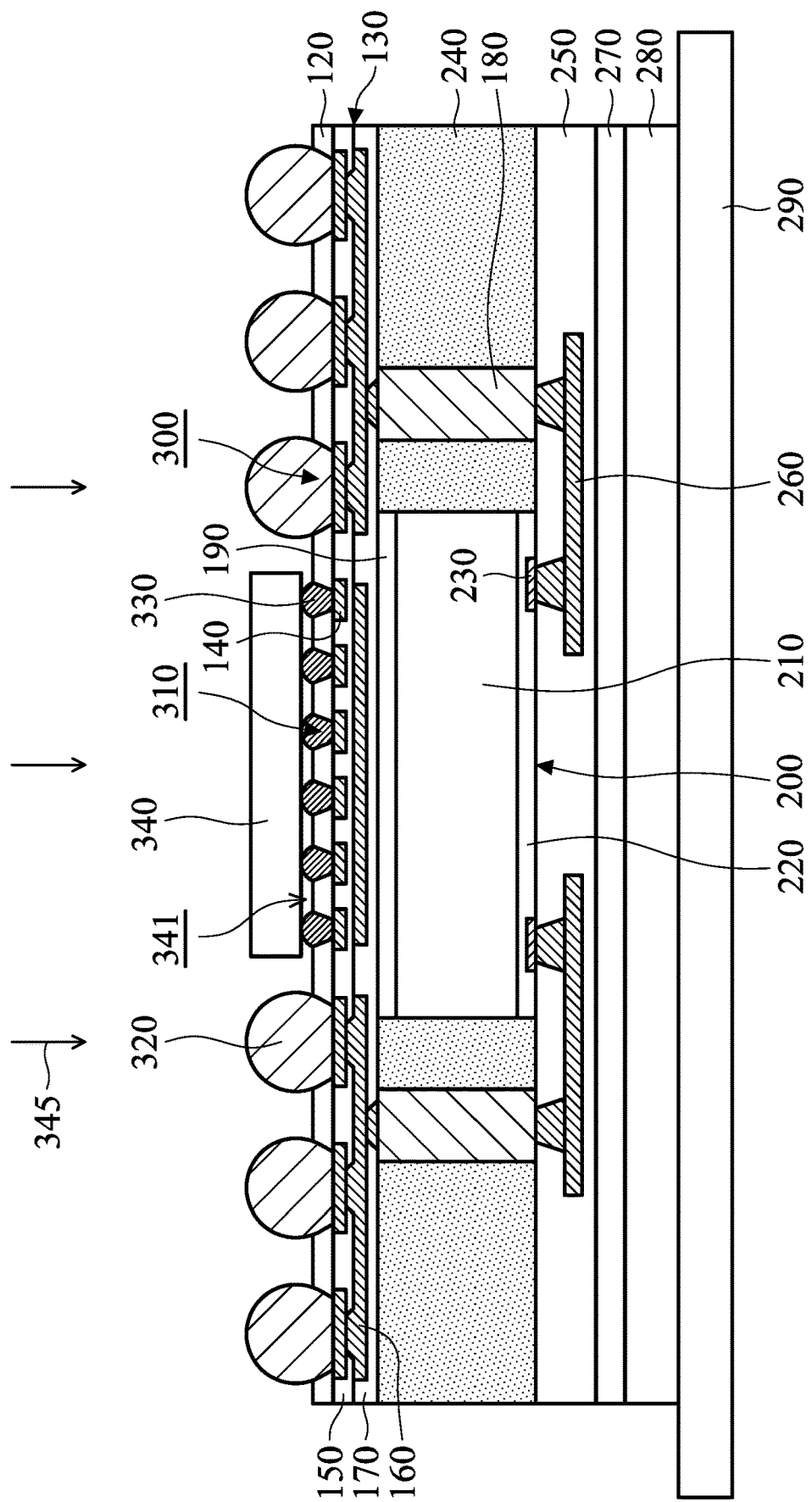

As shown in FIG. 1F, an element 340 is stacked over the redistribution structure 130, in accordance with some embodiments. In some embodiments, there is a space 341 between the element 340 and the base layer 120. The element 340 and the integrated circuit die 200 are on two opposite sides of the base layer 120. The element 340 and the connectors 320 are positioned side by side. In some embodiments, the connectors 320 are on two opposite sides of the element 340. In some other embodiments, the connectors 320 discontinuously surround the element 340.

In some embodiments, the element 340 is an integrated circuit die. For example, the integrated circuit die is a high-voltage die or another suitable die. However, embodiments of the disclosure are not limited thereto. In some other embodiments, the element 340 includes a package structure that contains one or more integrated circuit dies. The element 340 can be varied according to requirements.

In some embodiments, the front side (the active surface) of the element 340 faces the back side (the non-active surface) of the integrated circuit die 200. However, embodiments of the disclosure are not limited thereto. In some other embodiments, the front side of the element 340 faces the front side (the active surface) of the integrated circuit die 200.

Although FIG. 1F shows that there is one element 340 on the redistribution structure 130, embodiments of the disclosure are not limited thereto. In some other embodiments, there are multiple elements 340 on the redistribution structure 130.

In some embodiments, one or more connectors 330 are used to achieve the bonding between the element 340 and the redistribution structure 130, as shown in FIG. 1F. The connectors 330 fill the openings 310, and protrude from the base layer 120. The connectors 330 are electrically connected to the conductive layer 140 in the redistribution structure 130 through the openings 310. The connectors 330 include solder bumps, metal pillars, other suitable connectors, or a combination thereof. The size of the connectors 330 is smaller than that of the connectors 320. In some embodiments, the connectors 320 have a height greater than that of the connectors 330.

As shown in FIG. 1F, a reflow process 345 is performed over the connectors 320, the element 340, and the connectors 330, in accordance with some embodiments. In some embodiments, no dispensing process for depositing an underfill material is performed over the structure as shown in FIG. 1F. In some embodiments, there is no underfill material between the element 340 and the base layer 120. In some embodiments, the connectors 330 are not wrapped in an underfill material.

Figure 1G:
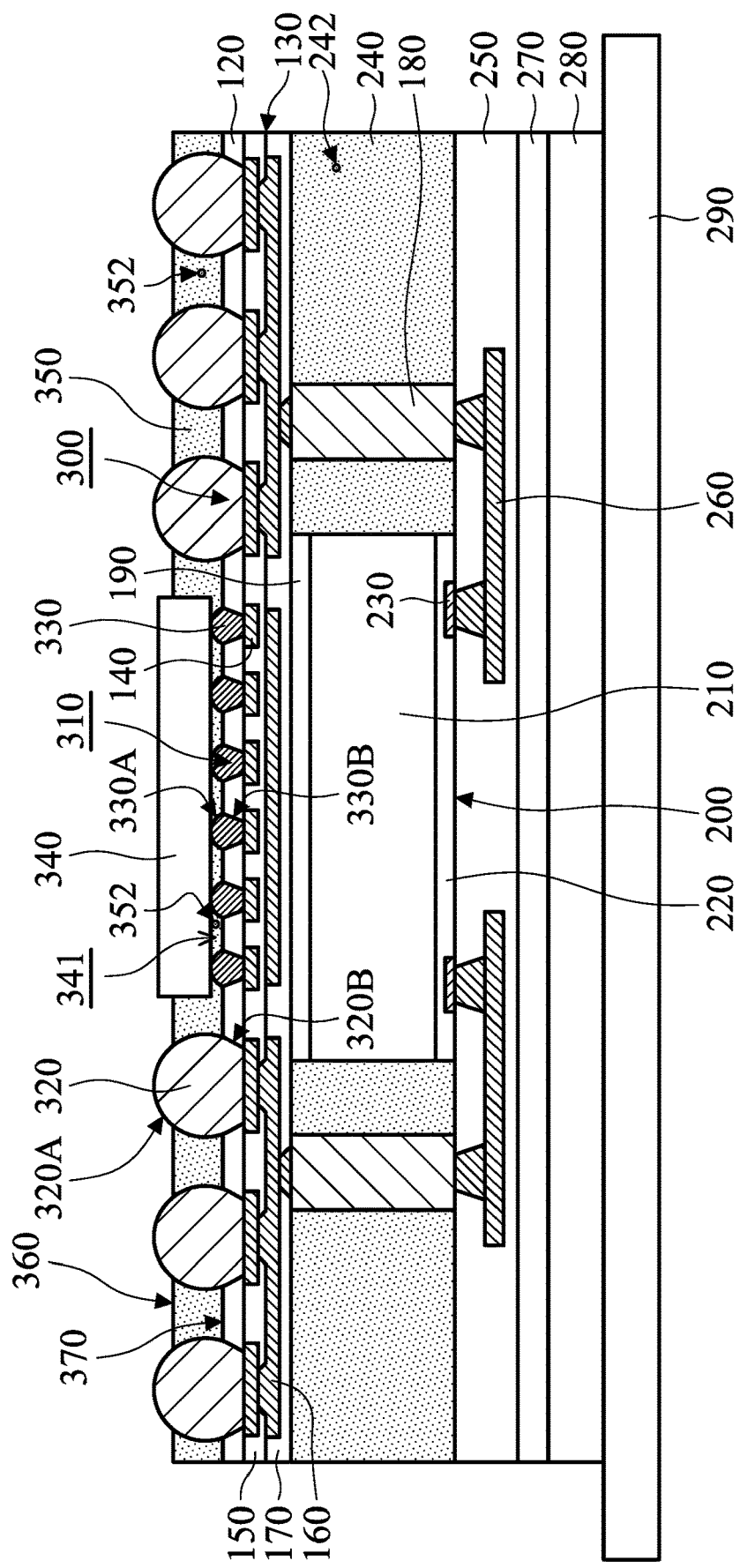

As shown in FIG. 1G, a molding compound layer 350 is deposited over the redistribution structure 130, in accordance with some embodiments. The molding compound layer 350 continuously surrounds the connectors 320 and extends between the element 340 and the redistribution structure 130. As a result, the connectors 320 and the connectors 330 are encapsulated by the molding compound layer 350.

The molding compound layer 350 continuously extends from side surfaces of the connectors 320 to side surfaces of the connectors 330. In some embodiments, the molding compound layer 350 is in direct contact with the side surfaces of the connectors 330 and the side surfaces of the connectors 320. In some embodiments, a portion of the molding compound layer 350 is laterally sandwiched between one of the connectors 320 and one of the connectors 330.

In some embodiments, the side surfaces of the connectors 320 and 330 are partially exposed from the base layer 120 before the formation of the molding compound layer 350. In some embodiments, the exposed side surfaces of the connectors 320 become covered during the formation of the molding compound layer 350. For example, the side surfaces of the connectors 320 are substantially completely covered by the molding compound layer 350 and the base layer 120. In some embodiments, the exposed side surfaces of the connectors 330 become covered during the formation of the molding compound layer 350.

The molding compound layer 350 has a top surface 360 and a bottom surface 370. The top surface 360 faces away from the integrated circuit die 200. In some embodiments, the top surface 360 is substantially flat. The bottom surface 370 face the integrated circuit die 200. In some embodiments, an upper portion 320A of the connectors 320 protrudes from the top surface 360. In some embodiments, a lower portion 320B of the connectors 320 protrudes from the bottom surface 370. In some embodiments, an upper portion 330A of the connectors 330 is embedded in the molding compound layer 350. In some embodiments, a lower portion 330B of the connectors 330 protrudes from the bottom surface 370.

In some embodiments, the molding compound layer 350 continuously surrounds the connectors 320, the connectors 330, and the element 340. The molding compound layer 350 fills the space 341 between the element 340 and the base layer 120 and extends between the connectors 320. In some embodiments, the space 341 is unsealed until forming the molding compound layer 350. The molding compound layer 350 also fills the space 342 between one of the connectors 320 and the element 340. As a result, the connectors 320, the connectors 330, and the element 340 are embedded in the same material layer (i.e., the molding compound layer 350).

The molding compound layer 350 continuously extends from the side surfaces of the connectors 320 to side surfaces of the element (or integrated circuit die) 340. In some embodiments, the side surfaces of the element 340 are partially or completely covered by the molding compound layer 350. In some embodiments, side surfaces of the element (or integrated circuit die) 340 become covered during the formation of the molding compound layer 350. In some embodiments, the molding compound layer 350 is in direct contact with the side surfaces of the element 340. In some embodiments, a portion of the molding compound layer 350 is laterally sandwiched between one of the connectors 320 and the element 340.

In some embodiments, the top surface of the element 340 is exposed from the molding compound layer 350. In some other embodiments, the top surface of the element 340 is covered by the molding compound layer 350.

In some embodiments, the molding compound layer 350 includes a polymer material. The molding compound layer 350 substantially does not include an underfill material, such as deformable gel or silicon rubber. In some embodiments, the molding compound layer 350 and the package layer 240 include substantially the same material. In some other embodiments, the molding compound layer 350 and the package layer 240 include different materials.

In some embodiments, the viscosity of the molding compound layer 350 is in a range from about 10 Pa·s to about 25 Pa·s. In some embodiments, the viscosity of the molding compound layer 350 is in a range from about 16 Pa·s to about 25 Pa·s. The viscosity of an underfill material may be in a range from about 5 Pa·s to about 15 Pa·s.

In some embodiments, the molding compound layer 350 includes fillers 352 dispersed therein. The fillers 352 may include insulating fibers, insulating particles, other suitable elements, or a combination thereof. In some embodiments, the fillers 352 have a diameter in a range from about 2 μm to about 30 μm. In some embodiments, the diameter of the fillers 352 is in a range from about 2 μm to about 15 μm. In some embodiments, one of the fillers 352 in the space 341 and another of the fillers 352 between the connectors 320 have substantially the same diameter.

In some embodiments, the size of the fillers 352 dispersed in the molding compound layer 350 is greater than those dispersed in an underfill material. The fillers dispersed in an underfill material may have a diameter in a range from about 0.1 μm to about 5 μm. For example, the diameter of the fillers dispersed in an underfill material is about 1 μm. In some embodiments, the diameter of the fillers 352 is not less than 5 μm. As a result, the molding compound layer 350 provides stronger structural strength than an underfill material.

In some embodiments, the molding compound layer 350 and the package layer 240 include the same filler. In some other embodiments, the molding compound layer 350 and the package layer 240 include different types of filler. In some embodiments, the size of the fillers 352 dispersed in the molding compound layer 350 is less than the fillers 242 dispersed in the package layer 240. The size, such as diameter, of the fillers 352 may be substantially the same as that of the fillers 242. In some embodiments, one of the fillers 352 in the space 341 and one of the fillers 242 have substantially the same diameter.

In some embodiments, a liquid molding compound material is applied over the redistribution structure 130. The liquid molding compound material includes epoxy, silica, another suitable material, or a combination thereof. In some embodiments, a thermal process is then performed to harden the molding compound material and to transform it into the molding compound layer 350.

In some embodiments, a molding process is used to deposit the molding compound layer 350. The molding process includes a compression molding process or another applicable process. In some embodiments, the top surface 360 of the deposited molding compound layer 350 is lower than the top surface of the element 340. In some other embodiments, the top surface 360 of the deposited molding compound layer 350 is substantially coplanar with the top surface of the element 340.

In some embodiments, no dispensing process is performed after the bonding of the element 340 and before the formation of the molding compound layer 350. In some embodiments, no dispensing process is performed after the formation of the molding compound layer 350 and before a subsequent process, such as a singulation process.

Afterwards, a singulation process is performed to separate the structure as shown in FIG. 1G into multiple package structures, in accordance with some embodiments. As a result, the molding compound layer 350 and the package layer 240 are diced. The carrier 290 is removed subsequently. One of the package structures (i.e., a package structure 400) is shown in FIG. 1H.

In some embodiments, the package structure 400 is further bonded to a substrate. The substrate is a printed circuit board, another package structure, or another suitable substrate. In some embodiments, the structure shown in FIG. 1G does not include the protection substrate 280. The protection substrate 280 may be provided over the package structure 400 after the singulation process.

Figure 1H:
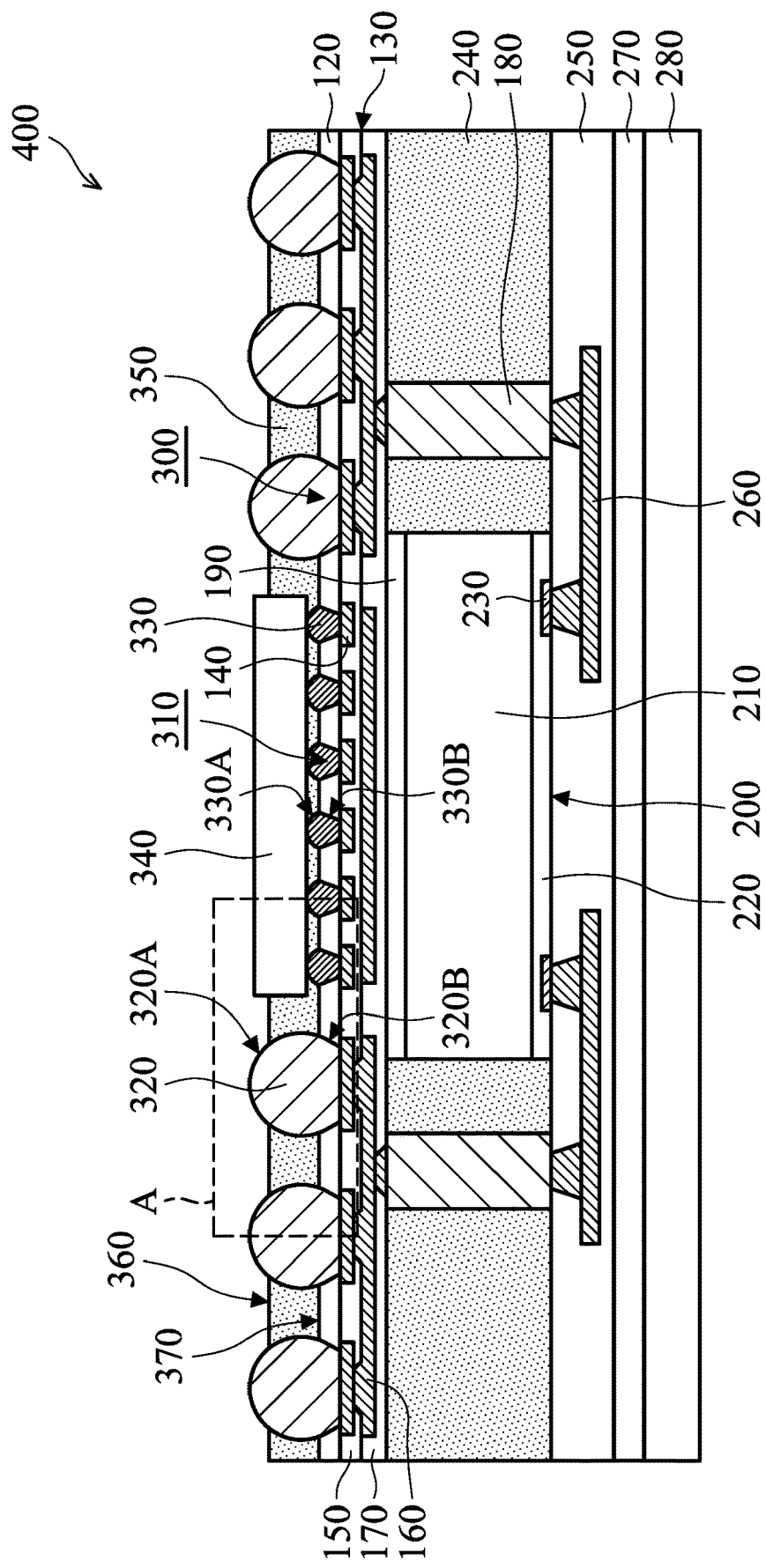

Although FIG. 1H shows that the size of the protection substrate 280 is the same as the size of the package structure 400, embodiments of the disclosure are not limited thereto. In some other embodiments, the size of the protection substrate 280 is greater than the size of the package structure 400. For example, the width of the protection substrate 280 may be greater than the width of the package structure 400.

Figure 2:
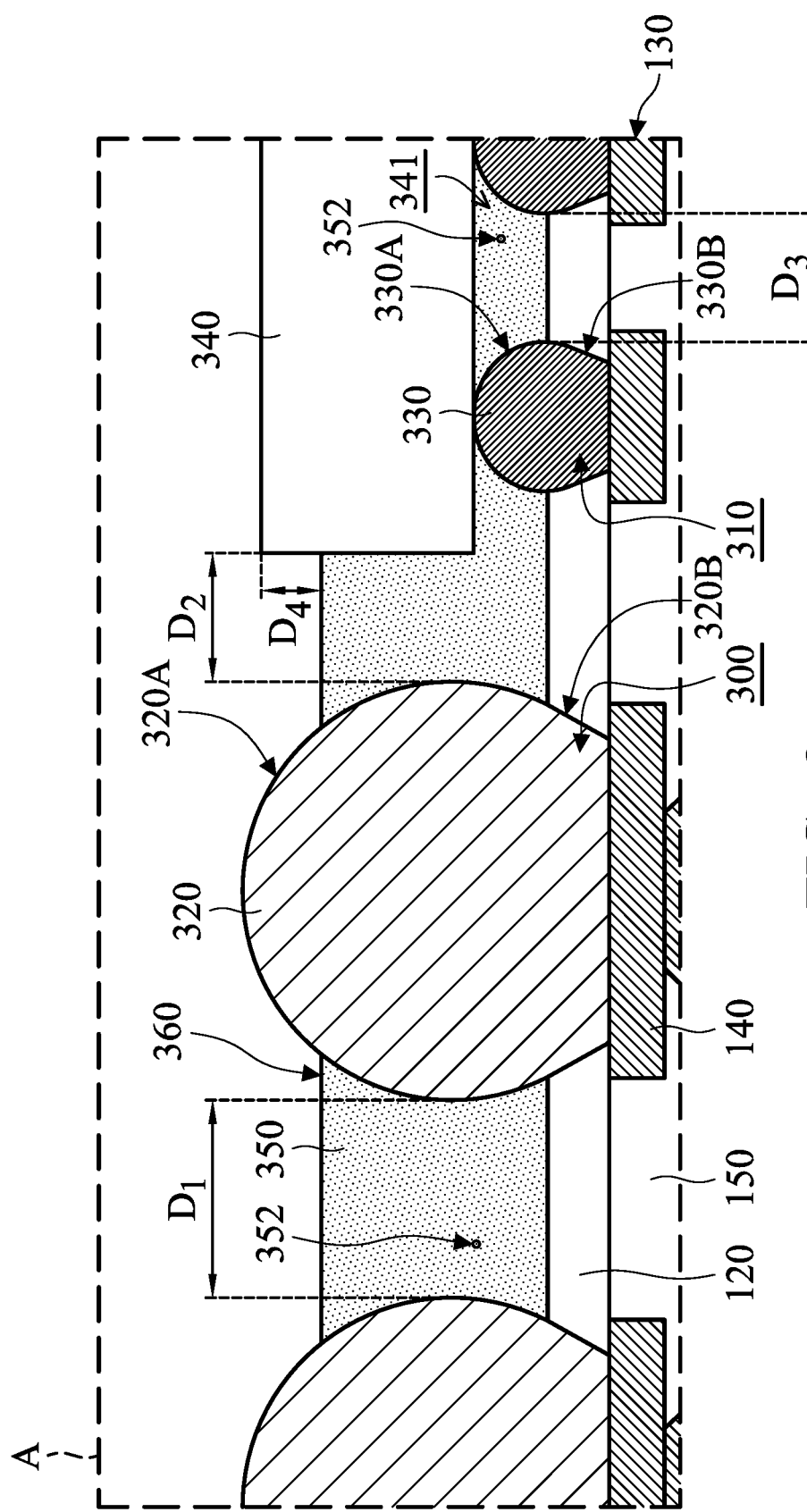
FIG. 2 is an enlarged cross-sectional view of a package structure, in accordance with some embodiments.

FIG. 2 is an enlarged cross-sectional view of a package structure, in accordance with some embodiments. In some embodiments, FIG. 2 shows an enlarged cross-sectional view of the region A shown in FIG. 1H.

As shown in FIG. 2, there is a distance $D_1$ between two of the connectors 320. In some embodiments, the distance $D_1$ is in a range from about 300 μm to about 500 μm. There is a distance $D_2$ between the element 340 and one of the connectors 320, which is adjacent to the element 340. In some embodiments, the distance $D_2$ is in a range from about 100 μm to about 200 μm. In some embodiments, the distance $D_2$ is less than the distance $D_1$. Embodiments of the disclosure are not limited thereto. In some other embodiments, the distance $D_2$ is substantially the same as or greater than the distance $D_1$.

As shown in FIG. 2, there is a distance $D_3$ between two of the connectors 330. In some embodiments, the distance $D_3$ is in a range from about 20 μm to about 150 μm. The distance $D_3$ is less than the distance $D_1$. In some embodiments, the distance $D_3$ is substantially the same as the distance $D_2$. Embodiments of the disclosure are not limited thereto. In some other embodiments, the distance $D_3$ is less or greater than the distance $D_2$.

In some embodiments, a distance $D_4$ between the top surface 360 of the molding compound layer 350 and the top surface of the element 340 is in a range from about 0 μm to about 100 μm.

In some cases, an underfill material layer is applied below a die. The underfill material layer may be provided by a dispensing method. For example, liquid underfill material is injected by a dispensing apparatus. The liquid underfill material flows below the die by capillary action and then cured. There is a large enough space around the die for the dispensing apparatus to inject liquid underfill material. In addition, since liquid underfill material flows by capillary action, a large space is not filled with an underfill material layer.

According to some embodiments of the disclosure, there is a molding compound layer 350 between the element 340 and the redistribution structure 130. Since the molding compound layer 350 does not include an underfill material, one or more dispensing processes are omitted. Accordingly, the space between the element 340 and one of the connectors 320 is not limited. For example, the distance $D_2$ may be reduced even further. As a result, the number of input and output (I/O) connections is increased, in accordance with some embodiments. Therefore, design flexibility of the package structure is enhanced.

In accordance with some embodiments, the connectors 320 beside the element 340 and the connectors 330 below the element 340 are encapsulated by the molding compound layer 350 during the same stage. A molding process is performed to deposit the molding compound layer 350 included in each of package structures. The molding compound layer 350 is cheaper than an underfill material. As a result, the cost and the fabrication time are reduced significantly. Embodiments of the disclosure provide a simpler and faster packaging process.

The molding compound layer 350 has a high gap-filling capability. Accordingly, the formation of the molding compound layer 350 is not constrained by differences between gap areas and/or gap heights. In some embodiments, the distance $D_1$ is much greater than the distance $D_3$. The space between the connectors 320 and the space between the element 340 and the base layer 120 is filled with the molding compound layer 350. In some embodiments, the distance $D_2$ is greater than the distance $D_3$. The space between one of the connectors 320 and the element 340 and the space between the element 340 and the base layer 120 is filled with the molding compound layer 350. As a result, the connectors 320 and the connectors 330 are together enclosed in the molding compound layer 350. The molding compound layer 350 provides the connectors 320 and the connectors 330 with sufficient protection. Therefore, device performance and reliability of the package structure are improved.

Many variations and/or modifications can be made to embodiments of the disclosure. For example, although the embodiments shown in FIGS. 1A-1H provide a package structure having a "fan-out" feature, embodiments of the disclosure are not limited thereto. Some other embodiments of the disclosure include package structures having a "fan-in" feature.

Many variations and/or modifications can be made to embodiments of the disclosure. For example, although the embodiments shown in FIGS. 1A-1H provide a chip on package (CoP) structure or package on package (PoP) structure, embodiments of the disclosure are not limited thereto.

Figure 3:
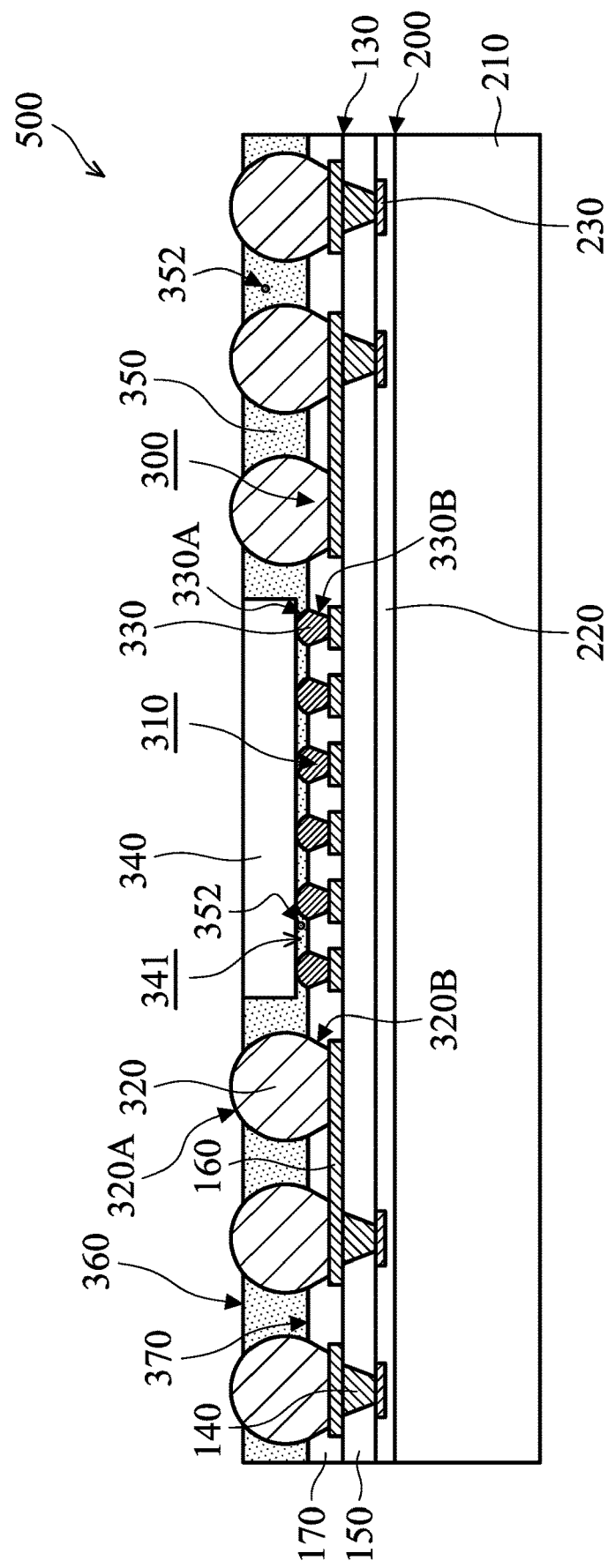
FIG. 3 is a cross-sectional view of a package structure, in accordance with some embodiments.

FIG. 3 is a cross-sectional view of a package structure, in accordance with some embodiments. As shown in FIG. 3, the element 340 in the package structure 500 is not stacked over a package feature. The element 340 is stacked over the integrated circuit die 200, which is not enveloped in a package layer. The materials and/or formation methods of the package structure 500 are the same as or similar to those of the package structure 400 illustrated in the aforementioned embodiments and are not repeated.

As shown in FIG. 3, the semiconductor substrate 210 is provided. In some embodiments, the semiconductor substrate 210 is a semiconductor wafer, such as a silicon wafer. A variety of device elements may be formed in or over the semiconductor substrate 210. The passivation layer 220 and the conductive pads 230 in the passivation layer 220 are formed over the semiconductor substrate 210.

In some embodiments, the redistribution structure 130 is formed over the semiconductor substrate 210. The redistribution structure 130 is electrically connected to the conductive pads 230 and the device elements in or over the semiconductor substrate 210.

Subsequently, multiple portions of the passivation layer 170 are removed to form the openings 300 and 310, in accordance with some embodiments. The openings 300 and 310 expose portions of the redistribution structure 130, such as portions of the conductive layer 160.

Afterwards, the connectors 320 fill the openings 300. The element 340 is bonded to the redistribution structure 130 through the connectors 330. The molding compound layer 350 encapsulates the connectors 320, the connectors 330, and the element 340. A singulation process is subsequently performed to form multiple package structures including the package structure 500.

As shown in FIG. 3, the top surface 360 of the molding compound layer 350 is substantially coplanar with the top surface of the element 340. As a result, the side surfaces of the element 340 are substantially completely encircled by the molding compound layer 350. The upper portion 320A of the connectors 320 protrudes from the top surface 360. In some other embodiments, the top surface 360 is lower than the top surface of the element 340.

Embodiments of the disclosure provide a package structure and methods for forming the same. The package structure includes an integrated circuit die with a first connector. The integrated circuit die and a second connector are positioned side by side. The first connector and the second connector are together surrounded by a molding compound layer during the same stage. As a result, the cost and the fabrication time are reduced significantly. The space between the integrated circuit die and the second connector is not limited. Therefore, embodiments of the disclosure provide a package structure with high design flexibility and reliability and provide a simpler and faster packaging process.

In accordance with some embodiments, a method for forming a package structure is provided. The method includes providing a first integrated circuit die. The method also includes forming a redistribution structure over the first integrated circuit die. The method further includes forming a base layer over the redistribution structure. The base layer has first openings and second openings. The first openings are wider than the second openings. In addition, the method includes forming first bumps over the redistribution structure. The first bumps have a lower portion filling the first openings. The method also includes bonding a second integrated circuit die to the redistribution structure through second bumps. The second bumps have a lower portion filling the second openings. There is a space between the second integrated circuit die and the base layer. The method further includes forming a molding compound layer over the base layer. The molding compound layer fills the space and surrounds the first bumps and the second bumps.

In accordance with some embodiments, a method for forming a package structure is provided. The method includes providing a first integrated circuit die. The method also includes performing a first molding process to form a package layer surrounding the first integrated circuit die. The method further includes forming a redistribution structure over the first integrated circuit die and the package layer. In addition, the method includes forming first bumps over the redistribution structure. The method also includes bonding a second integrated circuit die to the redistribution structure through second bumps after the formation of the first bumps. The method further includes performing a second molding process to form a molding compound layer between the first bumps and between the second bumps. Surfaces of the first bumps and the second bumps become covered by the molding compound layer during the second molding process.

In accordance with some embodiments, a package structure is provided. The package structure includes a first integrated circuit die. The package structure also includes a redistribution structure over the first integrated circuit die. The package layer surrounds the first integrated circuit die. The package structure further includes a base layer over the redistribution structure. The base layer has first openings and second openings. In addition, the package structure includes first bumps filling the first opening. The package structure also includes second bumps filling the second opening. The first bumps have a height greater than that of the second bumps. The package structure further includes a second integrated circuit die over the second bumps. There is a space between the second integrated circuit die and the base layer. The package structure includes a molding compound layer over the base layer. The molding compound layer fills the space and surrounds the first bumps and the second bumps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
   forming a base layer over a carrier substrate through an adhesive layer;
   forming a redistribution structure over the base layer, wherein the redistribution structure comprises conductive layers embedded in passivation layers;

disposing a first integrated circuit die over the redistribution structure;
forming a package layer surrounding the first integrated circuit die, wherein the package layer and the first integrated circuit die are on the same level, and the package layer has a first filler dispersed therein;
attaching the package layer to a carrier;
removing the carrier substrate and the adhesive layer to expose the base layer after attaching the package layer to the carrier;
forming first openings and second openings in the base layer to expose the conductive layers of the redistribution structure, wherein the first openings are wider than the second openings;
forming first bumps in the first openings of the base layer over the redistribution structure so that the first bumps are in direct contact with the conductive layers of the redistribution structure;
bonding a second integrated circuit die to the redistribution structure through second bumps, wherein the second bumps are formed in the second openings of the base layer so that the second bumps are in direct contact with the conductive layers of the redistribution structure, and a shortest distance between the first bumps on a first side of the second integrated circuit die is greater than a shortest distance between the second bumps; and
filling a molding compound layer in a space between the first bumps and the second bumps to form a molding compound layer over the base layer such that bottom portions of the first bumps and bottom portions of the second bumps are separated by the base layer and upper portions of the first bumps and upper portions of the second bumps are separated by the molding compound layer, wherein the molding compound layer has a second filler in the space, and a size of the second filler is less than that of the first filler.

2. The method for forming a package structure as claimed in claim 1, wherein the space is unsealed until performing a molding process to form the molding compound layer.

3. The method for forming a package structure as claimed in claim 2, wherein the first integrated circuit die is wider than the second integrated circuit die and overlaps the first bumps and the second bumps.

4. The method for forming a package structure as claimed in claim 1, wherein the method does not comprise performing a dispensing process after bonding the second integrated circuit die and before the formation of the molding compound layer.

5. The method for forming a package structure as claimed in claim 1, wherein the second integrated circuit die has a side surface, and the side surface becomes covered by the molding compound layer during the formation of the molding compound layer.

6. The method for forming a package structure as claimed in claim 1, wherein the molding compound layer has a third filler between the first bumps, and wherein the second filler has substantially the same diameter as the third filler.

7. The method for forming a package structure as claimed in claim 1, wherein forming the redistribution structure over the first integrated circuit die comprises:
laminating a base layer over a carrier substrate through an adhesive layer;
forming the redistribution structure over the base layer, wherein the redistribution structure comprises conductive layers embedded in passivation layers; and
disposing the first integrated circuit die over the redistribution structure.

8. The method for forming a package structure as claimed in claim 7, further comprising:
attaching the package layer to a carrier; and
removing the carrier substrate and the adhesive layer to expose the base layer after attaching the package layer to the carrier.

9. A method for forming a package structure, comprising:
laminating a base layer over a carrier substrate through an adhesive layer;
forming a redistribution structure over the base layer, wherein the redistribution structure comprises conductive layers embedded in passivation layers;
disposing a first integrated circuit die over the redistribution structure;
performing a first molding process to form a package layer surrounding the first integrated circuit die, wherein the package layer and the first integrated circuit die are on the same level;
attaching the package layer to a carrier;
removing the carrier substrate and the adhesive layer to expose the base layer after attaching the package layer to the carrier;
forming first openings and second openings in the base layer to expose the conductive layers of the redistribution structure;
forming first bumps in the first openings so that the first bumps are in direct contact with the conductive layers of the redistribution structure;
bonding a second integrated circuit die through second bumps formed in the second openings of the redistribution structure after the formation of the first bumps so that the second bumps are in direct contact with the conductive layers of the redistribution structure, wherein the first integrated circuit die in the package layer is wider than the second integrated circuit die and overlaps the first bumps and the second bumps, and wherein a first distance between the first bumps on a horizontal plane is greater than a second distance between the second integrated circuit die and one of the first bumps on the horizontal plane;
performing a second molding process to form a molding compound layer between the first bumps and between the second bumps, wherein surfaces of the first bumps and the second bumps become covered by the molding compound layer during the second molding process, and wherein the molding compound layer has first fillers dispersed therein, and the package layer has second fillers dispersed therein, and a size of the first filler is less than that of the second filler, and wherein a sidewall of the molding compound layer is aligned with a sidewall of the package layer on a vertical plane, and
wherein the first distance between the first bumps is in a range from about 300 µm to about 500 µm, and the second distance between the second integrated circuit die and one of the first bumps on the horizontal plane is in a range from about 100 µm to about 200 µm.

10. The method for forming a package structure as claimed in claim 9, wherein the second integrated circuit die has a side surface, and the side surface is exposed until performing the second molding process.

11. The method for forming a package structure as claimed in claim 9, wherein the molding compound layer has a top surface that is substantially flat, and the first bumps has an upper portion protruding from the top surface.

12. The method for forming a package structure as claimed in claim 9, wherein the second distance is substantially the same as a third distance between the second bumps.

13. A method for forming a package structure, comprising:
  forming an adhesive layer over a carrier substrate;
  forming a base layer over the adhesive layer;
  forming conductive layers in passivation layer as a redistribution structure over the base layer;
  forming conductive features over the redistribution structure;
  disposing a first integrated circuit die over the redistribution structure and between the conductive features;
  forming a package layer surrounding the first integrated circuit die and the conductive features, wherein the package layer and the first integrated circuit die are on the same level, and the package layer has a first filler dispersed therein;
  forming a protection layer covering the package layer, the first integrated circuit die, and the conductive features;
  removing the adhesive layer and the carrier substrate to expose the base layer;
  patterning the base layer to expose first portions and second portions of the conductive layers in the redistribution structure;
  forming first connectors in direct contact with the first portions of the conductive layers of the redistribution structure;
  bonding a second integrated circuit die to the redistribution structure through second connectors, wherein the second connectors are in direct contact with the second portions of the conductive layers of the redistribution structure, and the first connectors are wider and higher than the second connectors, and wherein the first connectors surround the second integrated circuit die and overlap a boundary of the first integrated circuit die, and wherein a first distance between the first connectors on a horizontal plane is greater than a second distance between the second integrated circuit die and one of the first connectors on the horizontal plane; and
  performing a molding process to form a molding compound layer between the first connectors and between the first connectors and the second integrated circuit die, wherein the second connectors below the second integrated circuit die are exposed before the molding process and become covered by the molding compound layer during the molding process, and wherein the molding compound layer has a second filler between the first connectors and the second integrated circuit die, and a size of the second filler is less than that of the first filler, and wherein the conductive feature is physically separated from the first integrated circuit die and electrically connected with the first integrated circuit die, and a top surface of the conductive feature is level with a top surface of the package layer, and
  wherein the second distance between the second integrated circuit die and one of the first connectors on the horizontal plane is in a range from about 100 μm to about 200 and a third distance between the second connectors on the horizontal plane is in a range from about 20 μm to about 150 μm.

14. The method for forming a package structure as claimed in claim 13, wherein the molding compound layer surrounds the second integrated circuit die, the first connectors and the second connectors, and wherein the molding compound layer exposes a top surface and a side surface of the second integrated circuit die.

15. The method for forming a package structure as claimed in claim 13, wherein the molding compound layer is applied without capillary action and continuously extends from a side surface of the first connectors to a side surface of the second connectors below the second integrated circuit die.

16. The method for forming a package structure as claimed in claim 13, wherein the molding compound layer adjoins the second integrated circuit die, the second connectors below the second integrated circuit die, and the first connectors beside the second integrated circuit die.

17. The method for forming a package structure as claimed in claim 13, wherein the first portions of the conductive layers of the redistribution layer are wider than the second portions of the conductive layers of the redistribution layer.

18. The method for forming a package structure as claimed in claim 17, wherein the first portions of the conductive layers of the redistribution layer overlap the conductive features and the second portions of the conductive layers of the redistribution layer overlap the first integrated circuit die.

19. The method for forming a package structure as claimed in claim 13, wherein top surfaces of the conductive features are substantially level with a top surface of the first integrated circuit die, and bottom surfaces of the conductive features are substantially level with a bottom surface of the first integrated circuit die.

20. The method for forming a package structure as claimed in claim 13, wherein the first integrated circuit die comprises a semiconductor substrate and a conductive pad, and the conductive pad and the redistribution structure are located at opposite sides of the semiconductor substrate of the first integrated circuit die, and the conductive pad is connected to the conductive features through a conductive structure embedded in the protection layer.

* * * * *